（12）United States Patent
Hosono et al.

(10) Patent No.: US 7,666,553 B2
(45) Date of Patent: Feb. 23, 2010

(54) FABRICATION METHOD FOR PHOTOMASK, FABRICATION METHOD FOR DEVICE AND MONITORING METHOD FOR PHOTOMASK

(75) Inventors: Koji Hosono, Kawasaki (JP); Yukihiro Sato, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 746 days.

(21) Appl. No.: 11/384,240

(22) Filed: Mar. 21, 2006

(65) Prior Publication Data

US 2007/0134562 A1    Jun. 14, 2007

(30) Foreign Application Priority Data

Dec. 14, 2005    (JP) ............... 2005-360526

(51) Int. Cl.
*G03F 1/00* (2006.01)
*G03F 7/20* (2006.01)

(52) U.S. Cl. .......................... 430/5; 430/311
(58) Field of Classification Search ............ 430/5
See application file for complete search history.

(56) References Cited

U.S. PATENT DOCUMENTS 5,888,674 A    3/1999    Yang et al.

6,440,613 B1    8/2002    Doan
6,558,855 B2    5/2003    Tanaka et al.
2004/0219439 A1 *  11/2004    Asano et al. ............... 430/5

FOREIGN PATENT DOCUMENTS

| JP | 2002-107911 | 4/2002 |
|---|---|---|
| JP | 2003-344987 | 12/2003 |
| JP | 2004-212482 | 7/2004 |
| KR | 2002-0023091 | 3/2002 |

OTHER PUBLICATIONS

Korean Office Action dated Mar. 30, 2007, Application No. 10-2006-32779.
European Search Report dated Jun. 30, 2006 for Application No. 06005944.1-2222.

* cited by examiner

*Primary Examiner*—Mark F Huff
*Assistant Examiner*—John Ruggles
(74) *Attorney, Agent, or Firm*—Westerman, Hattori, Daniels & Adrian, LLP

(57) ABSTRACT

A fabrication method for a photomask is disclosed. Two or more metal containing layers are formed over a substrate, and a main pattern and a monitor pattern are formed over one or more of the two or more metal containing layers other than the lowermost metal containing layer. Then, the monitor pattern is measured, and the monitor pattern after being measured is removed. Then, the main pattern is formed over the lowermost metal containing layer to fabricate a photomask formed from the two or more metal containing layers.

11 Claims, 7 Drawing Sheets

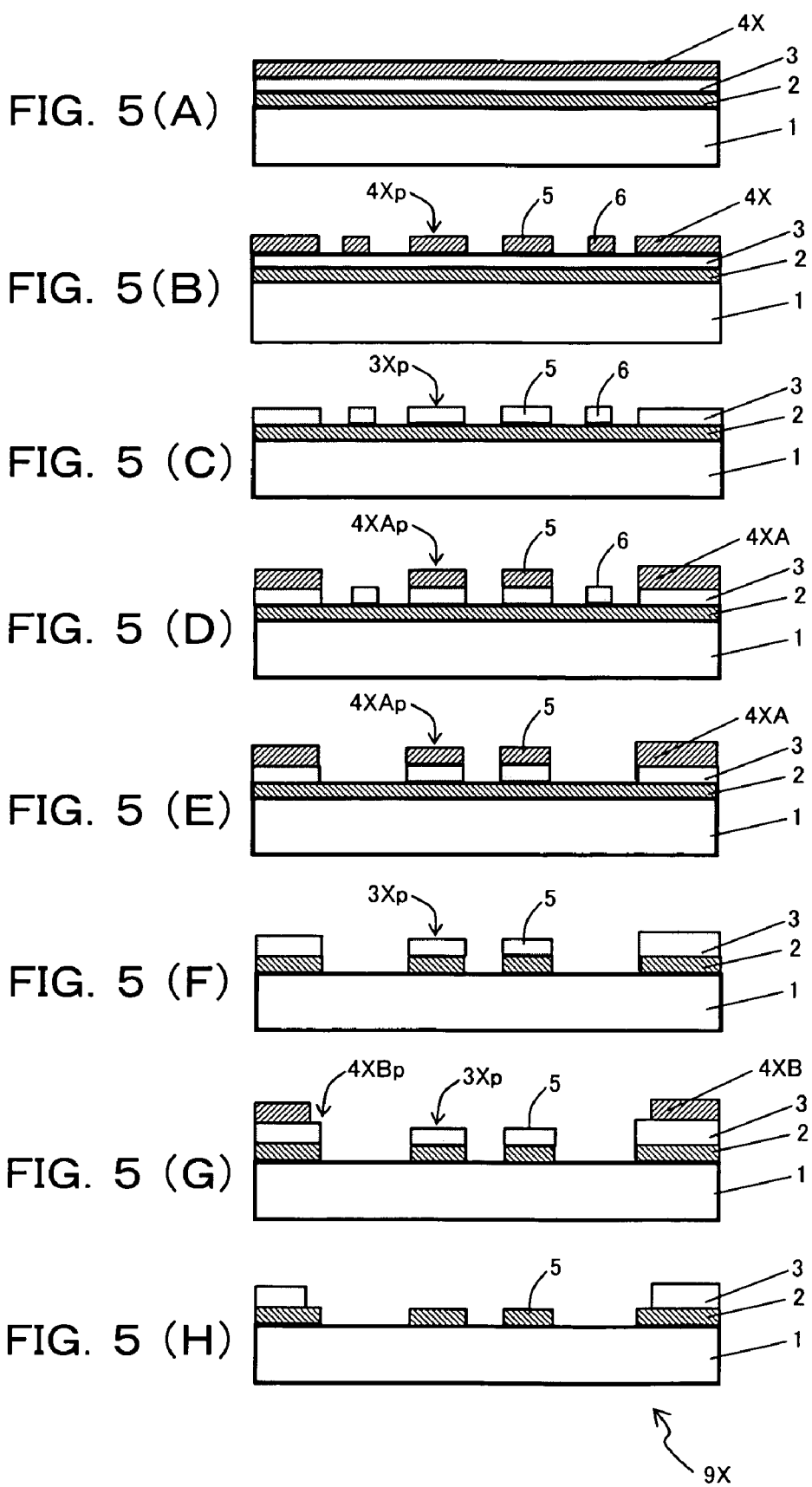

Related Art

FABRICATION METHOD FOR PHOTOMASK, FABRICATION METHOD FOR DEVICE AND MONITORING METHOD FOR PHOTOMASK

CROSS REFERENCE TO RELATED APPLICATIONS

This application is based on and hereby claims priority to Japanese Application No. 2005-360526 filed on Dec. 14, 2005 in Japan, the contents of which are hereby incorporated by reference.

BACKGROUND OF THE INVENTION

1) Field of the Invention

The present invention relates to a fabrication method for a photomask, a fabrication method for a device and a monitoring method for a photomask suitable for use for formation of a fine pattern when various solid-state devices such as, for example, a semiconductor device, a magnetic device element and so forth are fabricated.

2) Description of the Related Art

In recent years, it is demanded to form a very fine pattern in fabrication of an LSI (Large Scale Integrated circuit).

To this end, at an exposure step of transferring a fine circuit pattern to a wafer (semiconductor substrate), a photomask (phase shift mask) having a function for changing the phase of light used for light exposure to raise the contrast is used. Particularly, from such reasons as easy fabrication, a halftone type phase shift mask is used popularly.

The halftone type phase shift mask is formed, for example, as shown in FIG. 7(F), by laminating a translucent halftone phase shift layer 2 and a shading layer 3 in order on a transparent substrate 1 such as a synthetic quartz substrate.

The halftone type phase shift mask includes, for example, as shown in FIG. 6, a circuit pattern region (mask pattern region) 8 on which a circuit pattern (main pattern) to be transferred to a semiconductor chip is formed. In the circuit pattern region 8, the circuit pattern is formed by removing the shading layer 3 and removing the halftone phase shift layer 2 in accordance with the circuit pattern to expose the transparent substrate 1.

Where the exposure is performed using the halftone type phase shift mask formed in such a manner as described above, in a region wherein the transparent substrate 1 is exposed, light from an illumination system transmits as it is. On the other hand, in another region wherein the halftone phase shift layer 2 is exposed, the light from the illumination system transmits with the phase thereof shifted by 180 degree.

Meanwhile, the shading layer 3 remains in a region of the halftone type phase shift mask outside the circuit pattern region 8. Consequently, when the circuit pattern is transferred to the wafer, multiple exposure in an adjacent circuit pattern region (not shown) is prevented.

It is to be noted that, in FIG. 6, reference numeral 81 denotes a barcode pattern for mask identification, 82 a numbering pattern for mask identification, and 83 a fiducial pattern for positioning with a light exposure apparatus.

Incidentally, in such a photomask as described above, the assurance and management of the accuracy of the mask pattern are significant. As the accuracy assurance method for photomasks, an assurance method of the position accuracy and an assurance method of the dimensional accuracy are available.

Thus, assurance and management of the accuracy is conventionally performed by laying out monitor patterns on the inside and outside of an effective transfer region as occasion demands and measuring the monitor patterns. It is to be noted that a pattern forming method is disclosed, for example, in Japanese Patent Laid-Open No. 2002-107911.

Preferably, from a point of view that the accuracy of a photomask is measured with accuracy, as monitor patterns, simple diagrammatic patterns suitable for assurance and management of the accuracy are disposed at appropriate locations.

In the halftone type phase shift mask described above, as shown in FIG. 6, monitor patterns 6A for positional accuracy assurance of the mask pattern and monitor patterns 6B for dimensional accuracy assurance of the mask pattern are formed as the mask patterns 6 in a region outside a desired effective transfer region (in FIG. 6, a region which is surrounded by a broken line) 7 which includes the circuit pattern region 8.

Such a halftone type phase shift mask including the monitor patterns 6 (6A and 6B) as described above is fabricated in the following manner.

First, as shown in FIG. 7(A), a halftone phase shift layer 2 and a shading layer 3 are laminated on a transparent substrate 1.

Then, as shown in FIG. 7(A), a first resist layer 4 is formed on the shading layer 3, and, as shown in FIG. 7(B), a circuit pattern 5 and monitor patterns 6 (monitor patterns 6A for positional accuracy assurance and monitor patterns 6B for dimensional accuracy assurance) as a first resist pattern 4p are formed by performing processes including exposure (drawing), PEB (Post Exposure Bake) and development for the first resist layer 4.

Then, as shown in FIG. 7(C), the shading layer 3 is etched while the first resist layer 4 having the first resist pattern 4p thereon is used as a mask to form the circuit pattern 5 and the monitor patterns 6 (monitor patterns 6A for positional accuracy assurance and monitor patterns 6B for dimensional accuracy assurance) as the shading pattern 3p on the shading layer 3. Thereafter, the first resist layer 4 is removed.

Then, as shown in FIG. 7(D), the halftone phase shift layer 2 is etched while the shading layer 3 on which the shading pattern 3p is formed is used as the mask to form the circuit pattern 5 and the monitor patterns 6 on the halftone phase shift layer 2.

Thereafter, as shown in FIG. 7(E), a second resist layer 4A is formed on the shading layer 3, and a second resist pattern 4Ap for forming a desired effective transfer region (scanning region) 7 (refer to FIG. 6) including a circuit pattern region 8 (refer to FIG. 6) is formed by performing processes including exposure (drawing), PEB and development for the second resist Layer 4A. Then, as shown in FIG. 7(F), the shading layer 3 is selectively etched while the second resist layer 4A having the second resist pattern 4Ap thereon is used as the mask. Thereafter, the second resist layer 4A is removed. Consequently, the halftone type phase shift mask (photomask) is completed.

Then, the monitor patterns 6 (monitor patterns 6A for positional accuracy assurance and monitor patterns 6B for dimensional accuracy assurance) are measured in a state wherein the halftone type phase shift mask is completed.

In this manner, where the halftone type phase shift mask is fabricated, measurement of the monitor patterns 6 is performed and assurance and management of the accuracy of the mask pattern is performed in a state wherein the halftone type phase shift mask is completed.

SUMMARY OF THE INVENTION

However, in recent years, in photomasks for use for formation of a fine pattern, it has become very difficult to freely lay out the monitor patterns 6 in the effective transfer region 7.

For example, if such monitor patterns for positional accuracy assurance of the LINE type as denoted by reference character 6A in FIG. 6 are laid out in the effective transfer region 7 of a photomask for a HOLE, then the monitor patterns sometimes become a source of production of dust in a wafer process because transfer conditions optimum for HOLE patterns and transfer conditions optimum for LINE patterns are different from each other. Therefore, it is difficult to freely lay out the monitor patterns 6A in the effective transfer region 7.

Further, from a similar reason, also it is difficult to freely lay out the monitor patterns 6B for dimensional accuracy assurance each formed from a plurality of lines having various line widths in the effective transfer region 7.

Therefore, where the monitor patterns 6A and 6B are laid out in the effective transfer region 7, the patterns are complicated in shape or restricted in line width. Also OPC (Optical Proximity Correction) is sometimes required.

On the other hand, where the monitor patterns 6A and 6B cannot be laid out in the effective transfer region 7, the monitor patterns 6A and 6B are laid out outside the effective transfer region 7 as in the case of the halftone type phase shift mask (refer to FIG. 6) described hereinabove.

In this instance, the monitor patterns 6A and 6B are used for assurance and management upon fabrication of the photomask, and since the validity of the assurance decreases as the distance from the circuit pattern region (chip region) 8 increases, it is necessary to lay out the monitor patterns 6A and 6B as near to the circuit pattern region (chip region) 8 as possible.

However, if the monitor patterns 6A and 6B are laid out near to the chip region, then there is the possibility that, in a wafer process, the monitor patterns 6A and 6B may be transferred to the wafer by flare.

In this manner, the provision of the monitor patterns 6A and 6B is subject to various restrictions.

As a result, if, for example, monitor patterns for positional accuracy assurance cannot be laid out in or near to the effective transfer region 7, then there is the possibility that the reliability in assurance of the positional accuracy may be degraded. Further, if lines having various line widths necessary for management of the accuracy of a photomask cannot be provided as a monitor pattern for dimensional accuracy assurance, then dimensional measurement results of lines of various line widths cannot be obtained, and therefore, there is the possibility that the reliability in assurance of the dimensional accuracy may be degraded. Furthermore, as the line width of a monitor pattern becomes small, there is the possibility that the reproducibility which a measuring instrument originally has cannot be exhibited sufficiently and the reproducibility in measurement may be degraded.

The present invention provides a fabrication method for a photomask, a fabrication method for a device and a monitoring method for a photomask wherein patterns necessary for accuracy assurance and/or management of a photomask can be laid out freely.

According to an aspect of the present invention, there is provided a fabrication method for a photomask, comprising the steps of forming two or more metal containing layers over a substrate, forming a main pattern and a monitor pattern over one or more of the two or more metal containing layers other than the lowermost metal containing layer, measuring the monitor pattern, and removing the monitor pattern after measuring and forming the main pattern over the lowermost metal containing layer to fabricate a photomask formed from the two or more metal containing layers.

According to another aspect of the present invention, there is provided a fabrication method for a device, which comprises the steps of fabricating the photomask by the fabrication method for a photomask described above, and performing pattern transfer using the photomask.

According to a further aspect of the present invention, there is provided a monitoring method for a photomask, comprising the steps of forming two or more metal containing layers over a substrate, forming a main pattern and a monitor pattern over one or more of the two or more metal containing layers other than the lowermost metal containing layer over which a mask pattern is to be formed, and measuring the monitor pattern.

With the fabrication method for a photomask and the monitoring method for a photomask, the necessity to leave monitor patterns on a photomask to be fabricated finally is eliminated. Therefore, there is an advantage that patterns necessary for accuracy assurance or for management of a photomask can be laid out freely without the necessity to pay attention to a trouble which may otherwise be caused by a situation that the monitor patterns remain on the photomask because of an influence of flare or the like. Consequently, the reliability in accuracy assurance of the photomask and the reliability of a monitor can be secured sufficiently. As a result, a photomask having a degree of reliability higher than that of a conventional photomask and a sufficiently high degree of accuracy can be achieved.

On the other hand, with the fabrication method for a device, since a photomask (from which monitor patterns are removed) fabricated by the fabrication method for a photomask of the present invention is used, such a situation that the monitor patterns are transferred to a wafer by flare is eliminated. Therefore, there is an advantage that a trouble which is caused upon transfer by the monitor patterns remaining on the photomask can be prevented.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIGS. 5(A) to 5(H) are schematic sectional views illustrating a fabrication method for a photomask according to a second embodiment of the present invention;

DESCRIPTION OF THE PREFERRED EMBODIMENTS

In the following, a fabrication method for a photomask, a fabrication method for a device and a monitoring method for a photomask according to embodiments of the present invention are described with reference to the drawings.

First Embodiment

First, the fabrication method for a photomask and the fabrication method for a device according to a first embodiment of the present invention are described with reference to FIGS. 1(A) to 1(G), 2, 3, and 4(A) to 4(L).

The fabrication method for a photomask of the present invention is used for fabrication, for example, of a halftone type (HT type) phase shift photomask.

In the fabrication method for a photomask according to the present embodiment, monitor patterns used for accuracy assurance and management of a photomask are measured halfway of a photomask fabrication process, and the monitor patterns are removed after the measurement.

The fabrication method for a photomask according to the present embodiment is described below taking a positive type halftone phase shift photomask (positive type photomask) as an example with reference to FIGS. 1(A) to 1(G).

Figure 1A:
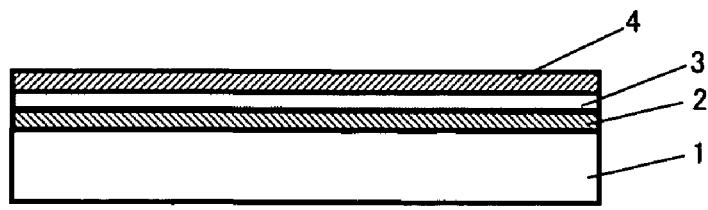
FIGS. 1(A) to 1(G) are schematic sectional views illustrating a fabrication method for a photomask according to a first embodiment of the present invention.

First, as shown in FIG. 1(A), a halftone phase shift layer (translucent film) 2 formed, for example, from a MoSiON film and a shading layer 3 formed, for example, from a lamination film of chrome and chrome oxide are laminated in order on a transparent substrate 1 formed, for example, from synthetic quartz.

Then, as shown in FIG. 1(A), a first resist layer 4 is formed by applying a resist, for example, by spin coating on the shading layer 3. In the present embodiment, in order to fabricate a positive type halftone phase shift photomask, a positive type resist layer is formed as the first resist layer 4 to be formed first.

Figure 1B:
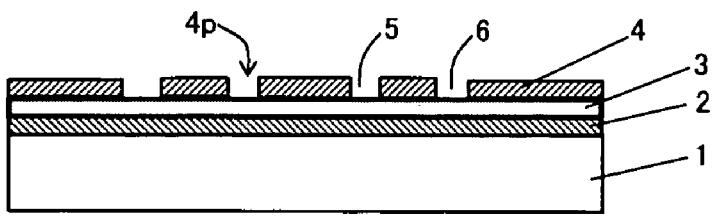

Then, as shown in FIG. 1(B), a main pattern (circuit pattern) 5 and monitor patterns (monitor patterns for positional accuracy assurance and monitor patterns for dimensional accuracy assurance) 6 are formed as first resist patterns (here, positive type resist patterns) 4p by performing processes including exposure (drawing), PEB (Post Exposure Bake) and development for the first resist layer 4. It is to be noted that, depending upon the used resist, the PEB process may not be performed.

Figure 1C:
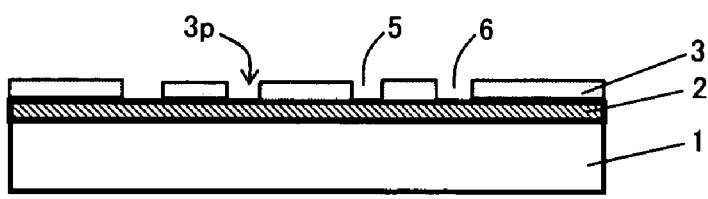

Thereafter, as shown in FIG. 1(C), the shading layer 3 is selectively etched while the first resist patterns 4p are used as an etching mask to form the main pattern 5 and the monitor patterns 6 as shading patterns 3p, and then the first resist layer 4 is removed.

Figure 2:
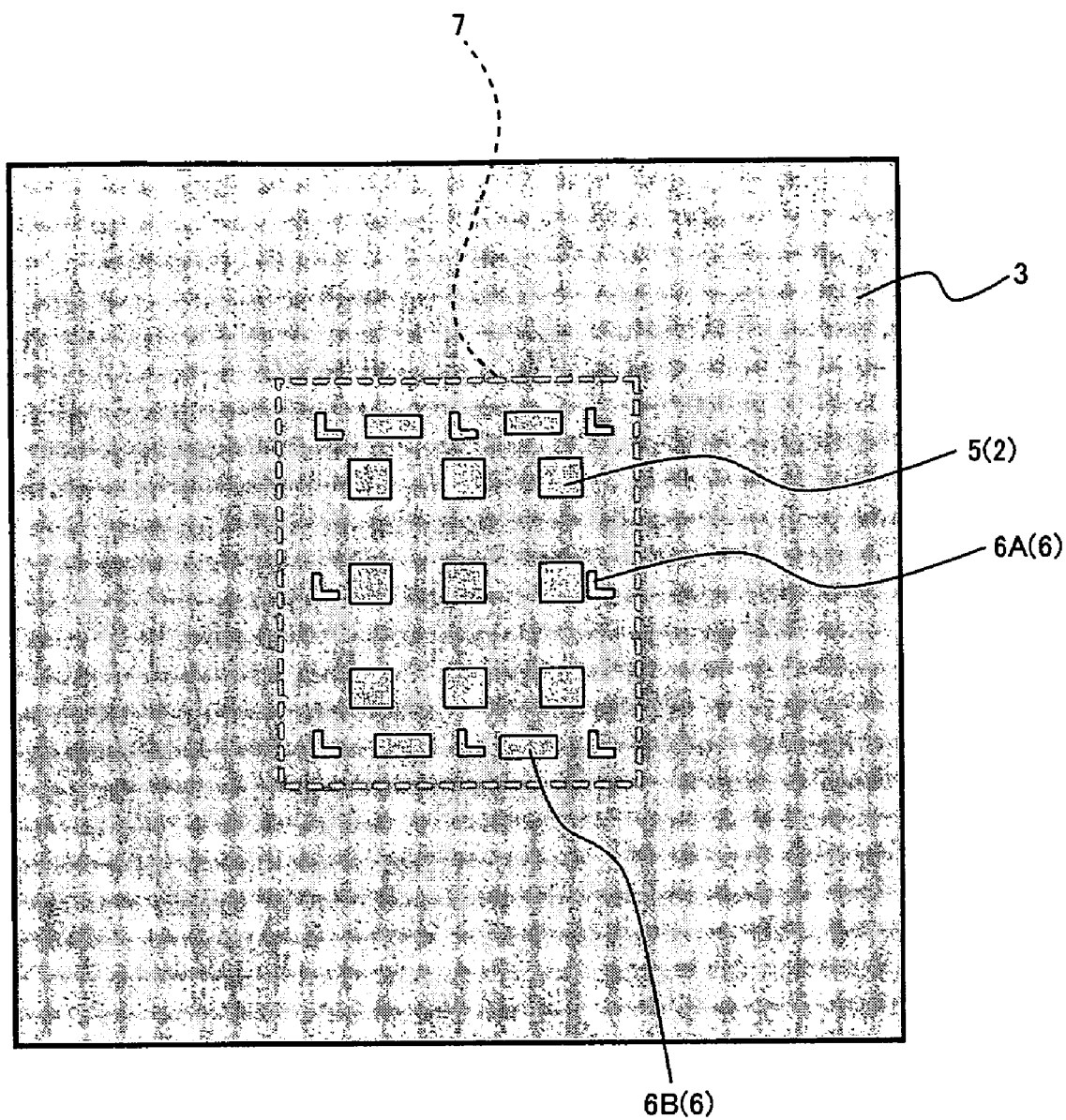
FIG. 2 is a schematic top plan view illustrating a state wherein monitor patterns are formed in the fabrication method for a photomask according to the first embodiment of the present invention.

In the present embodiment, as shown in a schematic top plan view of FIG. 2, monitor patterns 6A for positional accuracy assurance and monitor patterns 6B for dimensional accuracy assurance are laid out as the monitor patterns 6 in an effective transfer region 7. It is to be noted that the monitor patterns 6 are not limited to those for use for assurance of the accuracy (positional accuracy or dimensional accuracy) of the main pattern 5, but the monitor patterns 6 may be used for management of the photomask.

Then, in this state, the monitor patterns 6 (6A, 6B) are measured.

Figure 1D:
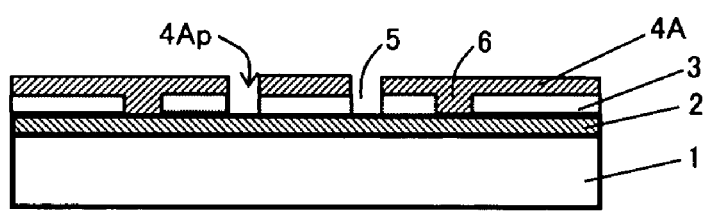

After the monitor patterns 6 are measured, as shown in FIG. 1(D), a second resist layer 4A is formed by applying resist to the shading layer 3. Then, second resist patterns (here, positive type resist patterns) 4Ap are formed by drawing the main pattern 5 on the second resist layer 4A and developing the main pattern 5. It is to be noted that, depending upon the used resist, PEB may be performed.

It is to be noted here that, by drawing and developing the main pattern 5 on the second resist layer 4A, the edges of the main pattern 5 formed on the shading layer 3 and the edges of the second resist patterns 4Ap formed on the second resist layer 4A are aligned with each other. However, the main pattern 5 need not always be drawn or developed on the second resist layer 4A, and the second resist layer 4A may be formed at least so that the monitor patterns 6 are covered. Therefore, at this step, a drawing apparatus having a high degree of drawing accuracy need not be used.

Figure 1E:
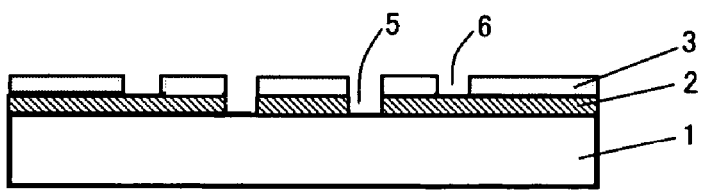

Then, as shown in FIG. 1(E), the halftone phase shift layer 2 is selectively etched while the second resist layer 4A (or shading layer 3 exposed without being covered with the second resist layer 4A) is used as an etching mask to form the main pattern 5 on the halftone phase shift layer 2. Thereafter, the second resist layer 4A is removed.

At this time, since the monitor patterns 6 formed on the shading layer 3 are entirely covered with the second resist layer 4A, the portion of the halftone phase shift layer 2 on which the monitor pattern 6 is formed remains without being etched.

Figure 1F:
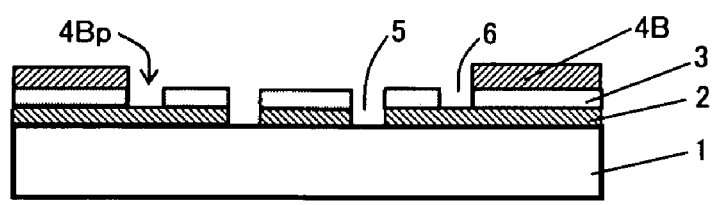

Thereafter, as shown in FIG. 1(F), a third resist layer 4B is formed by applying resist to the shading layer 3. Then, third resist patterns 4Bp are formed by performing processes including exposure (drawing) and development for the overall face of the circuit pattern region 8. It is to be noted that, depending upon the used resist, PEB may be performed.

Figure 1G:
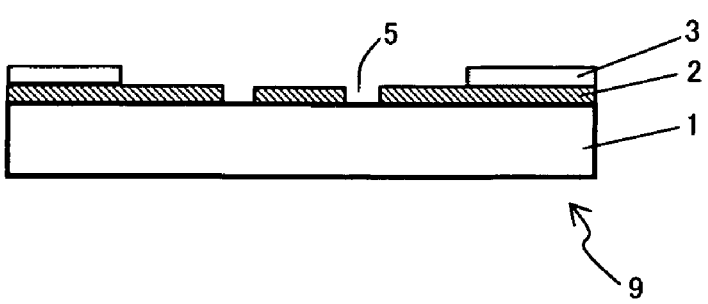

Then, the shading layer 3 is selectively etched while the third resist layer 4B (third resist patterns 4Bp) is used as an etching mask. Thereafter, the third resist layer 4B is removed. Consequently, a halftone type phase shift mask (photomask) 9 is completed as shown in FIG. 1(G).

It is to be noted here that, while principally the main pattern 5 and the monitor patterns 6 are described, a barcode pattern 81 for mask identification formed as a light transmission portion, a numbering pattern 82 for mask identification and a fiducial pattern 83 for a wafer exposure apparatus are formed through steps similar to those for producing the main pattern 5.

Figure 3:
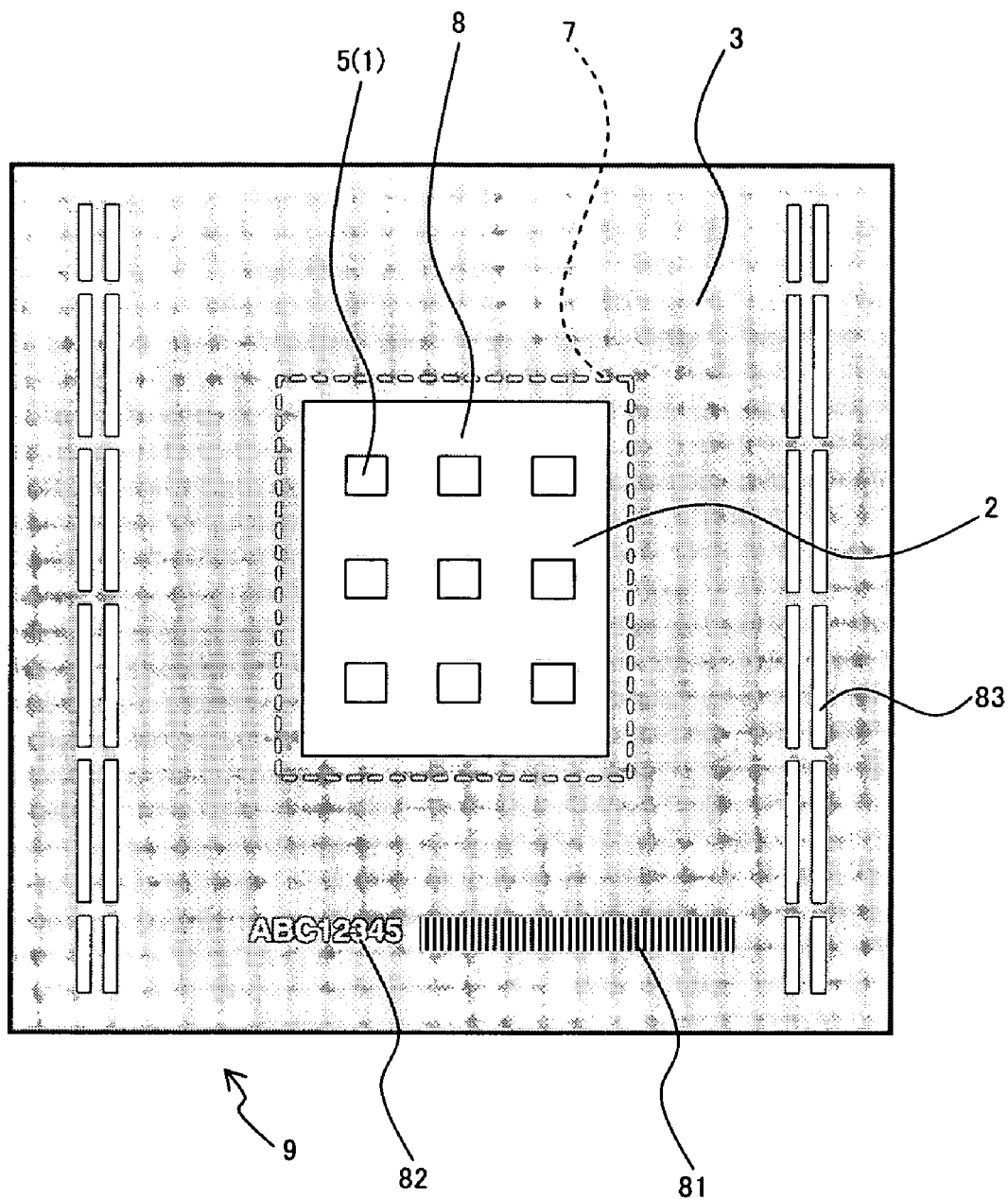
FIG. 3 is a schematic top plan view showing a photomask fabricated by the fabrication method for a photomask according to the first embodiment of the present invention.

In the present embodiment, such a photomask 9 as shown in FIG. 3 is fabricated. In particular, the photomask 9 according to the present embodiment is fabricated such that the monitor patterns 6 are not formed in the effective transfer region 7.

In this manner, in the present fabrication method for a photomask, two or more metal containing layers 2 and 3 are formed over a substrate 1. Then, a main pattern 5 and monitor patterns 6 (monitor patterns 6A for positional accuracy assurance and monitor patterns 6B for dimensional accuracy assurance) are formed over one or more metal containing layers 3 other than the lowest layer 2 from among the two or more metal containing layers 2 and 3. Therefore, the one or more metal containing layers 3 other than the lowest layer 2 are formed from a material which allows selectively etching. Then, in this state, the monitor patterns 6 are measured. After the measurement, the monitor patterns 6 are removed and the main pattern 5 is formed on the metal containing layer 2 of the lowest layer. Consequently, a photomask formed from two or more metal containing layers 2 and 3 is fabricated.

Since the monitor patterns 6 are removed and do not remain on the finally fabricated photomask 9, the monitor patterns 6 necessary for assurance and management of the accuracy of the photomask 9 can be freely laid out in the effective transfer region 7 without the necessity to pay attention to a trouble which may otherwise be caused by a situation that the monitor patterns 6 remain on the photomask 9 because of an influence of flare or the like.

A reason is described below why the monitor patterns 6 are measured halfway of the photomask fabrication process as described above.

As described in the description of the background art hereinabove, normally it is common to measure and monitor the monitor patterns 6 at the final step after the metal containing layer (metal film) 2 of the lowest layer is etched to form a pattern. However, originally, in order to measure and monitor the monitor patterns 6A for positional accuracy assurance used for assurance of the position accuracy, the patterns may be formed in the form of a step. Accordingly, measurement of the monitor patterns 6 (monitor patterns 6A for positional accuracy assurance) at the final step need not necessarily be performed.

Further, the bias accuracy when a metal film of the highest layer is etched while a resist layer is used as a mask is a main factor which decides a CD (critical dimension) characteristic. For example, in such a halftone type phase shift mask as shown in FIGS. 1(A) to 1(G), the bias accuracy when the shading layer denoted by reference numeral 3 in FIGS. 1(A) to 1(G) is etched is significant.

Where the etching of a metal film is performed while a resist layer is used as a mask, the etching bias is closely associated with the regression amount of the resist upon metal film etching. Further, there is the possibility that the resist regression amount may vary depending upon the condition of the resist or the condition of the etching apparatus. Conventionally, the monitor patterns 6 (monitor patterns 6B for dimensional accuracy assurance) of the completed photomask are measured. However, by measuring the monitor patterns 6 after the metal film is etched while the resist film is used as a mask [for example, refer to FIG. 1(C)], the dimensional accuracy of the metal film when the resist film is used as a mask can be monitored directly in comparison with the conventional measurement method.

In this manner, with the fabrication method for a photomask according to the present embodiment, the monitor patterns 6 need not be left on the photomask 9 fabricated finally. Therefore, there is an advantage that patterns necessary for performing assurance and management of the accuracy of the photomask can be freely laid out without the necessity to pay attention to a trouble which may arise from a monitor pattern remaining on the photomask by an influence of flare or the like. Consequently, the reliability in accuracy assurance of the photomask and the reliability of a monitor for management of, for example, a tendency of a mask and so forth can be secured sufficiently. As a result, a photomask having a degree of reliability higher than that of a conventional photomask and a sufficiently high degree of accuracy can be achieved.

It is to be noted that, in the present fabrication method for a photomask, where it is compared with the conventional fabrication method for a photomask, a step of forming a second resist pattern is required additionally. However, the basic fabrication process of the present fabrication method is substantially same as that of a conventional fabrication method for a halftone type phase shift mask. Therefore, there is an advantage also in that a fabrication apparatus commonly used can be used as it is.

It is to be noted that, while, in the embodiment described above, the monitor patterns 6 are measured after the shading layer 3 is etched and the resist 4 is removed, the timing of the measurement of the monitor patterns 6 is not limited to this. For example, the monitor patterns 6 may be measured after the halftone phase shift layer 2 is etched and the resist 4A is removed.

Now, a fabrication method for a device according to the present embodiment is described with reference to FIGS. 4(A) to 4(L).

The present fabrication method for a device includes the steps of fabricating the photomask by the fabrication method for a photomask described above, performing pattern transfer to a wafer using the photomask (exposure step).

The fabrication method for a device is described in detail below.

Figure 4A:
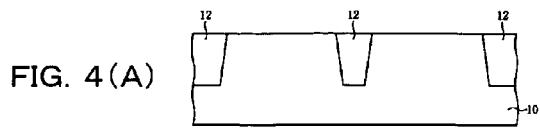
FIGS. 4(A) to 4(L) are schematic sectional views illustrating a fabrication method for a device according to the first embodiment of the present invention.

First, as shown in FIG. 4(A), an element isolation region 12 is formed on a silicon substrate (wafer) 10, for example, by an STI (Shallow Trench Isolation) method. It is to be noted that, in FIG. 4(A), a left side device region is determined as a region in which an n-type transistor is to be formed while a right side device region is determined as a region in which a p-type transistor is to be formed.

Figure 4B:
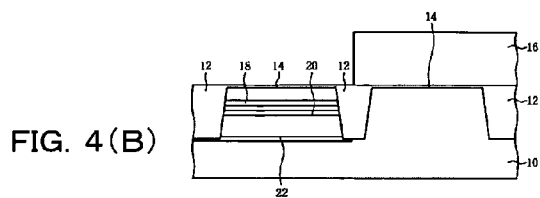

Then, as shown in FIG. 4(B), a sacrifice oxide film 14 is formed on the device regions defined by the device isolation region 12, for example, by a thermal oxidation method. Then, a photoresist film 16 is formed by photolithography such that the n-type transistor formation region is exposed while the p-type transistor region is covered. Further, ion implantation is performed while the photoresist film 16 is used as a mask to form p-type impurity diffusion regions 18, 20 and 22 in the silicon substrate 10 in the n-type transistor formation region.

Here, the p-type impurity diffusion region 18 is formed by ion implantation of, for example, indium ions ($In^+$) in the conditions of an acceleration energy of 60 keV and a dose amount of $1 \times 10^{13}$ $cm^{-2}$.

The p-type impurity diffusion region 20 is formed by ion implantation of, for example, indium ions ($In^+$) in the conditions of an acceleration energy of 180 keV and a dose amount of $3 \times 10^{13}$ $cm^{-2}$.

The p-type impurity diffusion region 22 is formed by ion implantation of, for example, boron ions ($B^+$) in the conditions of an acceleration energy of 150 keV and a dose amount of $3 \times 10^{13}$ $cm^{-2}$.

Figure 4C:
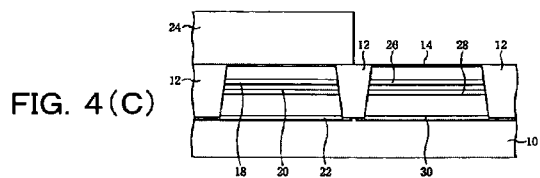

Then, as shown in FIG. 4(C), a photoresist film 24 is formed by photolithography such that the p-type transistor formation region is exposed while the n-type transistor formation region is covered. Then, ion implantation is performed while the photoresist film 24 is used as a mask to form n-type impurity diffusion regions 26, 28 and 30 in the silicon substrate 10 in the p-type transistor formation region.

Here, the n-type impurity diffusion region 26 is formed by ion implantation of, for example, arsenic ions ($As^+$) in the conditions of an acceleration energy of 100 keV and a dose amount of $5 \times 10^{12}$ $cm^{-2}$.

The n-type impurity diffusion region 28 is formed by ion implantation of, for example, arsenic ions ($As^+$) in the conditions of an acceleration energy of 150 keV and a dose amount of $3 \times 10^{13}$ $cm^{-2}$.

The n-type impurity diffusion region 30 is formed by ion implantation of, for example, phosphorus ions ($P^+$) in the conditions of an acceleration energy of 300 keV and a dose amount of $3 \times 10^{13}$ $cm^{-2}$.

Figure 4D:
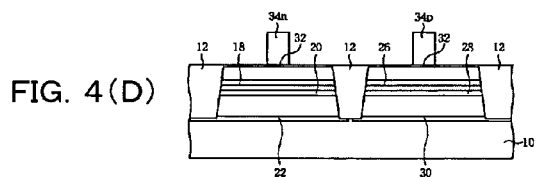

Thereafter, the sacrifice oxide film 14 is removed by wet etching using aqueous solution, for example, of the fluoric acid type. Then, as shown in FIG. 4(D), a gate insulation film 32 formed from a silicon oxide film of a film thickness of, for example, 1 nm is formed on the device regions exposed as a result of the removal of the sacrifice oxide film 14, for example, by a thermal oxidation method.

Then, a polysilicon film (not shown) of a film thickness of, for example, 100 nm is deposited on the gate insulation film 32, for example, by a CVD (Chemical Vapor Deposition) method. Then, the polysilicon film is patterned by photolithography and dry etching to form gate electrodes 34n and 34p formed from the polysilicon film as seen in FIG. 4(D).

Here, the gate electrode 34n is the gate electrode of an n-type transistor while the gate electrode 34p is the gate electrode of a p-type transistor.

Figure 4E:
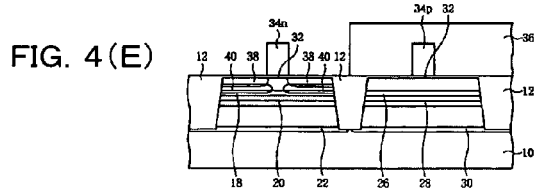

Then, as shown in FIG. 4(E), a photoresist film 36 is formed by photolithography such that the n-type transistor formation region including the gate electrode 34n is exposed while the p-type transistor formation region including the gate electrode 34p is covered. Then, the ion implantation is performed while the photoresist film 36 and the gate electrode 34n are used as a mask to form n-type impurity diffusion regions 38, which are extension regions of the n-type transistor, in the silicon substrate 10 on the opposite sides of the gate electrode 34n.

The n-type impurity diffusion regions 38 are formed by ion implantation of, for example, arsenic ions ($As^+$) in the conditions of an acceleration energy of 2 keV and a dose amount of $1\times10^{15}$ $cm^{-2}$. Further, as shown in FIG. 4(E), ion implantation is performed while the photoresist film 36 and the gate electrode 34n are used as a mask to form p-type pocket regions 40 in the n-type transistor formation region.

The p-type pocket regions 40 are formed by ion implantation of, for example, indium ions ($In^+$) in the conditions of an acceleration energy of 50 keV, a dose amount of $2\times10^{13}$ $cm^{-2}$ and a tilt angle of 25 degrees with respect to a normal line to the substrate.

Figure 4F:
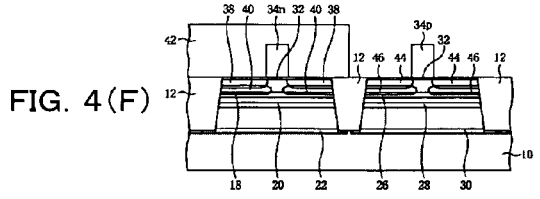

Then, as shown in FIG. 4(F), a photoresist film 42 is formed by photolithography such that the p-type transistor formation region is exposed while the n-type transistor formation region is covered. Then, ion implantation is performed while the photoresist film 42 and the gate electrode 34p are used as a mask to form p-type impurity diffusion regions 44, which become extension regions of the p-type transistor, in the silicon substrate 10 on the opposite sides of the gate electrode 34p.

The p-type impurity diffusion regions 44 are formed by ion implantation of, for example, boron ions ($B^+$) in the conditions of an acceleration energy of 0.5 keV and a dose amount of $1\times10^{15}$ $cm^{-2}$. Further, as shown in FIG. 4(F), ion implantation is performed while the photoresist film 42 and the gate electrode 34p are used as a mask to form n-type pocket regions 46 in the p-type transistor formation region.

The n-type pocket regions 46 are formed by ion implantation of, for example, arsenic ions ($As^+$) in the conditions of an acceleration energy of 50 keV, a dose amount of $2\times10^{13}$ $cm^{-2}$ and a tilt angle of 25 degrees with respect to a normal line to the substrate.

Figure 4G:
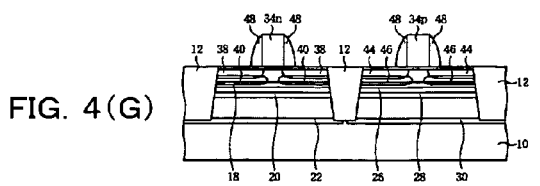

Then, as shown in FIG. 4(G), a silicon oxide film of a film thickness of, for example, 100 nm is deposited, for example, by a CVD method, and then the silicon oxide film is etched back by dry etching to form side wall insulation films 48 on side walls of the gate electrodes 34n and 34p.

Figure 4H:
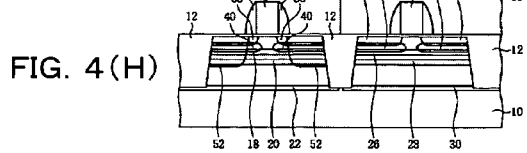

Thereafter, as shown in FIG. 4(H), a photoresist film 50 is formed by photolithography such that the n-type transistor formation region is exposed while the p-type transistor formation region is covered. Then, ion implantation is performed while the photoresist film 50, gate electrode 34n and side wall insulation films 48 as a mask to form n-type impurity diffusion regions 52 in the silicon substrate 10 on the opposite sides of the gate electrode 34n.

The n-type impurity diffusion regions 52 are formed by ion implantation of, for example, phosphorus ions ($P^+$) in the conditions of an acceleration energy of 20 keV and a dose amount of $5\times10^{15}$ $cm^{-2}$.

Figure 4I:
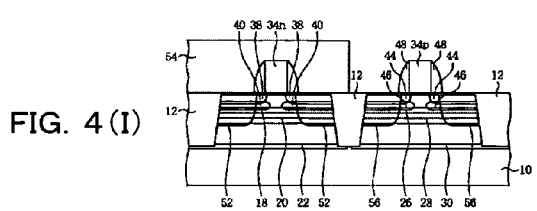

Thereafter, as shown in FIG. 4(I), a photoresist film 54 is formed by photolithography such that the p-type transistor formation region is exposed while the n-type transistor formation region is covered. Then, ion implantation is performed while the photoresist film 54, gate electrode 34p and side wall insulation films 48 as a mask to form p-type impurity regions 56 in the silicon substrate 10 on the opposite sides of the gate electrode 34p.

The p-type impurity regions 56 are formed by ion implantation of, for example, boron ions ($B^+$) in the conditions of an acceleration energy of 5 keV and a dose amount of $5\times10^{15}$ $cm^{-2}$.

Figure 4J:
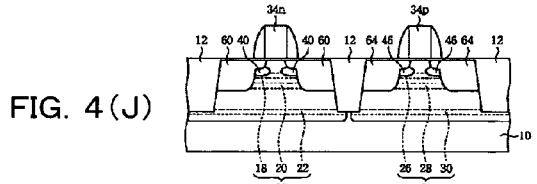

Then, a heat treatment, for example, for a short period of time of 3 seconds at 1,000° C. is performed to activate the implanted impurities. Consequently, a p-type well 58 including the p-type impurity diffusion regions 18, 20 and 22 and n-type source/drain regions 60 of the extension source-drain structure including the n-type impurity diffusion regions 38 and 52 are formed in the n-type transistor formation region as shown in FIG. 4(J). Meanwhile, in the p-type transistor formation region, an n-type well 62 including the n-type impurity diffusion regions 26, 28 and 30 and p-type source/drain regions 64 of the extension source-drain structure including the p-type impurity diffusion regions 44 and 56 are formed.

A gate structure body including the gate insulation film 32, gate electrodes 34n and 34p and side wall insulation films 48 is formed in this manner.

Figure 4K:
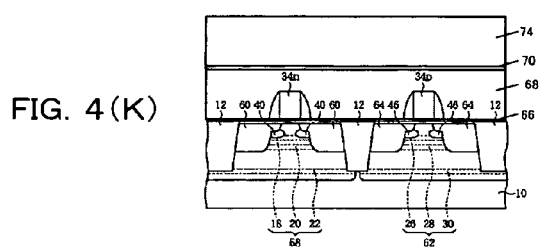

Thereafter, as shown in FIG. 4(K), a silicon nitride film 66 is formed such that it covers the overall area of the gate structure body and the silicon substrate 10. Further, an interlayer insulation film 68 formed from a silicon oxide film of a thickness of, for example, 400 nm is formed on the silicon nitride film 66, for example, by a CVD method. Thereafter, the interlayer insulation film 68 is flattened using, for example, a CMP (Chemical Mechanical Polishing) method.

Then, the source/drain regions 60 and 64 of the transistors are exposed to form contact holes for leading out the electrodes therethrough.

At the contact hole formation step, a phase shift mask fabricated by the fabrication method for a photomask according to the embodiment described hereinabove is used.

To this end, as shown in FIG. 4(K), an antireflection film 70 and a photoresist film 74 are formed on the interlayer insulation film 68 first.

Then, exposure is performed using the phase shift mask according to the present embodiment by means of a reducing projection exposure apparatus which uses, for example, an ArF excimer laser as a light source to transfer the circuit pattern. The exposure conditions in this instance may be, for example, a numerical aperture (NA) of 0.70, a σ value of 0.70 and an exposure amount of 470 $J/cm^2$.

Figure 4L:
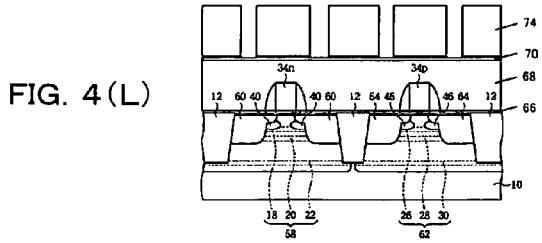
Figure 6:
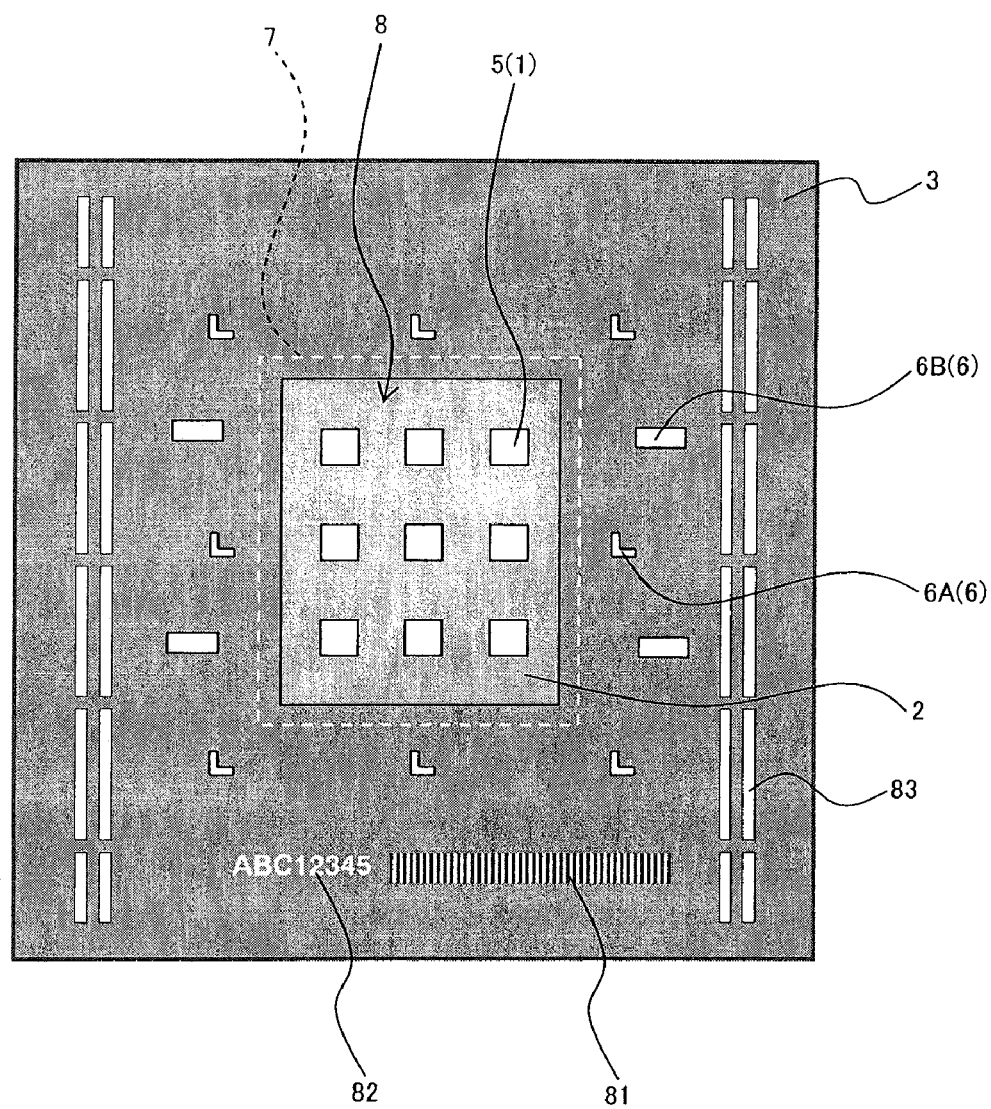
FIG. 6 is a schematic top plan view showing an example of a related art layout of monitor patterns.
Figure 7A:
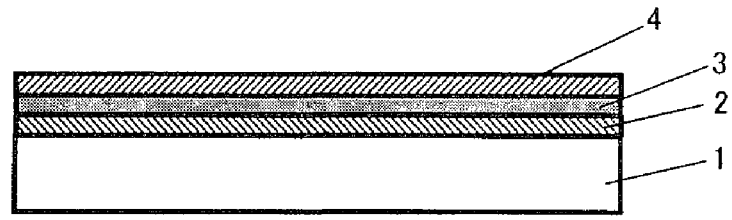
FIGS. 7(A) to 7(F) are schematic sectional views illustrating a related art fabrication method for a halftone type phase shift mask.
Figure 7B:
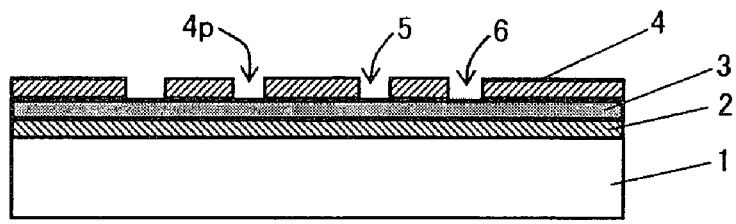
Figure 7C:
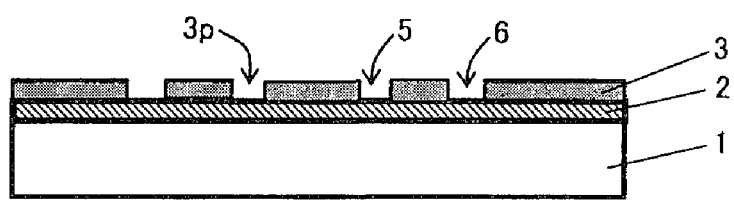
Figure 7D:
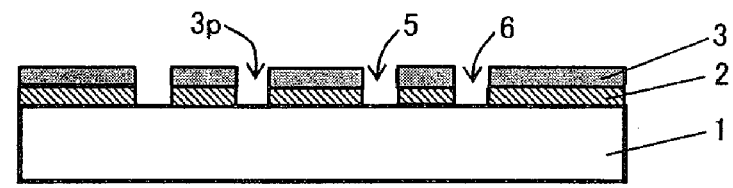
Figure 7E:
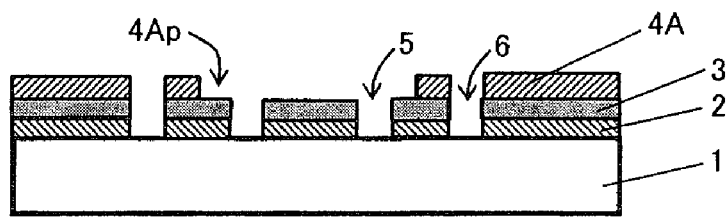
Figure 7F:
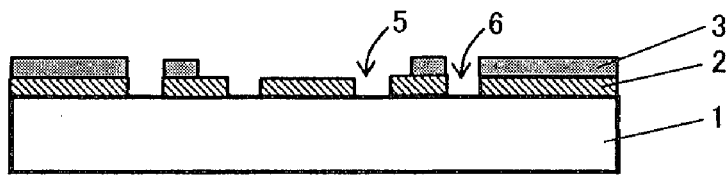

Then, development is performed to form a resist pattern on the photoresist film 74 as shown in FIG. 4(L).

Thereafter, a device is fabricated through popular steps.

Accordingly, with the fabrication method for a device according to the present embodiment, since the photomask 9 (from which the monitor patterns 6 are removed) fabricated by the fabrication method for a photomask according to the embodiment described above is used, such a situation that the monitor patterns 6 are transferred to a wafer by flare is eliminated. Therefore, the fabrication method for a device according to the present embodiment is advantageous in that a trouble which is caused upon transfer by the monitor patterns 6 remaining on the photomask 9 can be prevented.

In this regard, a semiconductor device fabricated in such a manner as described above was inspected using a wafer pattern inspection apparatus (for example, KLA2350 by KLA). As a result of the inspection, a defect arising from the photomask was not detected, and the effectiveness of the photomask fabricated by the fabrication method for a photomask according to the present embodiment was confirmed.

Second Embodiment

Now, a fabrication method for a photomask and a fabrication method for a device according to a second embodiment of the present invention are described with reference to FIGS. 5(A) to 5(H).

The fabrication method for a photomask according to the present embodiment is different from that of the first embodiment described hereinabove in that a negative type halftone phase shift photomask (negative type photomask) is fabricated. It is to be noted that, in FIGS. 5(A) to 5(H), like elements to those of the first embodiment described hereinabove (refer to FIGS. 1(A) to 1(G)) are denoted by like reference characters.

In the following, the fabrication method for a photomask according to the present embodiment is described particularly with reference to FIGS. 5(A) to 5(H).

First, as shown in FIG. 5(A), a halftone phase shift layer (translucent film) 2 formed, for example, from a MoSiON film and a shading layer 3 formed, for example, from a laminated film of chrome and chrome oxide are laminated successively on a transparent substrate 1 made of, for example, synthetic quartz.

Then, as shown in FIG. 5(A), resist is applied to the shading layer 3, for example, by spin coating to form a first resist layer 4X. In the present embodiment, since a negative type halftone phase shift photomask is fabricated, a negative type resist layer is formed as the first resist layer 4X to be formed first.

Then, as shown in FIG. 5(B), exposure (drawing), PEB and development are performed for the first resist layer 4 to form a main pattern (circuit pattern) 5 and monitor patterns (monitor patterns for positional accuracy assurance and monitor patterns for dimensional accuracy assurance) 6 are formed as first resist patterns (here, negative type resist patterns) 4Xp. It is to be noted that, depending upon the used resist, PEB may not be performed.

Then, as shown in FIG. 5(C), the shading layer 3 is selectively etched while the first resist patterns 4Xp are used as an etching mask to form the main pattern 5 and the monitor patterns 6 as shading patterns 3Xp. Thereafter, the first resist layer 4X is removed.

Then, in this state, measurement of the monitor patterns 6 (6A and 6B) is performed.

After the measurement of the monitor patterns 6, as shown in FIG. 5(D), resist is applied to the shading layer 3 to form a second resist layer 4XA. Then, the main pattern is drawn and developed on the second resist layer 4XA such that the monitor patterns 6 formed on the shading layer 3 are exposed to form second resist patterns (here, positive type resist patterns) 4XAp. It is to be noted that, depending upon the used resist, PEB may not be performed.

Then, as shown in FIG. 5(E), the shading layer 3 is selectively etched while the second resist layer 4XA (second resist patterns 4XAp) is used as an etching mask to remove the monitor patterns 6.

Thereafter, as shown in FIG. 5(F), the second resist layer 4XA is removed, and the halftone phase shift layer 2 is selectively etched while the shading layer 3 is used as an etching mask to form the main pattern 5 on the halftone phase shift layer 2.

Thereafter, as shown in FIG. 5(G), resist is applied to the shading layer 3 to form a third resist layer 4XB. Then, the circuit pattern region 8 is exposed (drawn) and developed over the entire area thereof to form third resist patterns 4XBp. It is to be noted that, depending upon the used resist, PEB may be performed.

Then, as shown in FIG. 5(H), the shading layer 3 is selectively etched while the third resist layer 4XB (third resist patterns 4XBp) is used as an etching mask, and then the third resist layer 4XB is removed, thereby completing a halftone type phase shift mask (photomask) 9X.

It is to be noted here that, while principally the main pattern 5 and the monitor patterns 6 are described, a barcode pattern 81 for mask identification formed as a light transmission portion, a numbering pattern 82 for mask identification and a fiducial pattern 83 for a wafer exposure apparatus are formed through steps similar to those for producing the main pattern 5.

Further, it is to be noted that remaining particulars of the present embodiment are similar to those of the first embodiment described hereinabove, and therefore, overlapping description of them is omitted herein to avoid redundancy.

Accordingly, with the fabrication method for a photomask according to the present embodiment, also where a negative type halftone phase shift photomask is fabricated, the monitor patterns 6 need not be left on the photomask 9X fabricated finally similarly as in the case of the first embodiment described hereinabove. Therefore, there is an advantage that patterns necessary for performing assurance and management of the accuracy of the photomask can be freely laid out without the necessity to pay attention to a trouble which may arise from a monitor pattern remaining on the photomask by an influence of flare or the like. Consequently, the reliability in accuracy assurance of the photomask and the reliability of a monitor for management of, for example, a tendency of a mask and so forth can be secured sufficiently. As a result, a photomask having a degree of reliability higher than that of a conventional photomask and a sufficiently high degree of accuracy can be achieved.

[Others]

It is to be noted that, while, in the embodiments described above, a halftone type phase shift mask having two metal containing layers is described as an example, the photomask is not limited to this, but may be any photomask only if it has two or more metal containing layers.

For example, the photomask may be a binary mask whose patterns are formed from a transmission portion (for example, of quartz substrate) and a shading portion (for example, of chrome) and wherein a metal containing layer (metal containing layer which allows selective etching) is provided on the shading portion (that is, a binary mask having two metal containing layers). Further, the photomask may be such a modification to the halftone type shift mask of any of the embodiments described hereinabove that a metal containing layer (metal containing layer which allows selective etching) is provided on the shading layer (that is, a halftone type phase shift mask having three metal containing layers). The masks described are hard mask type photomasks wherein not resist but a metal containing layer is used for etching of the shading layer.

Further, while, in the embodiments described above, the present invention is applied to a fabrication method for a photomask, the present invention may be carried out also as a monitoring method for a photomask.

In this instance, the monitoring method for a photomask is configured such that monitor patterns are measured halfway of a photomask fabrication process.

In particular, two or more metal containing layers such as metal containing layers 2 and 3 are formed on a substrate 1. Then, a main pattern 5 and monitor patterns 6 (monitor patterns 6A for positional accuracy assurance and monitor patterns 6B for dimensional accuracy assurance) are formed over one or more metal containing layers 3 other than the lowermost layer 2 on which a mask pattern is to be formed finally from among the two or more metal containing layers 2 and 3. To this end, the one or more metal containing layers 3 other than the lowermost layer 2 are formed from a material which allows selective etching. Then, in this state, the monitor patterns 6 are measured. Then, a result of the measurement of the monitor patterns 6 is used for accuracy assurance of the main pattern 5 and/or for management of the photomask.

The present invention is not limited to the embodiment specifically described above, and variations and modifications can be made without departing from the scope of the present invention.

What is claimed is:

1. A fabrication method for a photomask, comprising:
   forming two or more metal containing layers over a transparent substrate;
   forming a main pattern and a monitor pattern within one or more of the two or more metal containing layers other than the lowermost metal containing layer;
   measuring the monitor pattern; and
   removing the monitor pattern after measuring and forming the main pattern within the lowermost metal containing layer to fabricate a photomask formed from the two or more metal containing layers over the transparent substrate.

2. The fabrication method for a photomask as claimed in claim 1, wherein the two or more metal containing layers include a halftone phase shift layer and a shading layer.

3. The fabrication method for a photomask as claimed in claim 1, wherein the two or more metal containing layers include a shading layer, and a metal containing layer which can be selectively etched.

4. The fabrication method for a photomask as claimed in claim 1, wherein the main pattern and the monitor pattern are formed by etching the one or more of the two or more metal containing layers other than the lowermost metal containing layer.

5. The fabrication method for a photomask as claimed in claim 1, wherein the main pattern is formed within the lowermost metal containing layer by etching using as an etching mask the main pattern formed within the one or more of the two or more metal containing layers other than the lowermost metal containing layer.

6. The fabrication method for a photomask as claimed in claim 1, wherein, after the monitor pattern is measured, the main pattern is formed within the lowermost metal containing layer by using an etching mask formed so as to cover the monitor pattern without covering the main pattern, and thereafter, a positive photomask is fabricated by removing the monitor pattern.

7. The fabrication method for a photomask as claimed in claim 1, wherein the monitor pattern is removed after the monitor pattern is measured, and thereafter, a negative photomask is fabricated by forming the main pattern within the lowermost metal containing layer.

8. The fabrication method for a photomask as claimed in claim 1, wherein the monitor pattern is a monitor pattern for positional accuracy assurance.

9. The fabrication method for a photomask as claimed in claim 1, wherein the monitor pattern is a monitor pattern for dimensional accuracy assurance.

10. A fabrication method for a device, comprising:
    fabricating a photomask; and
    performing pattern transfer using the photomask;
    wherein the photomask is fabricated by a fabrication method for a photomask, comprising;
    forming the two or more metal containing layers over a transparent substrate,
    forming a main pattern and a monitor pattern within one or more of the two or more metal containing layers other than the lowermost metal containing layer,
    measuring the monitor pattern, and
    removing the monitor pattern after measuring and forming the main pattern within the lowermost metal containing layer to fabricate the photomask formed from the two or more metal containing layers over the transparent substrate.

11. A monitoring method for a photomask, comprising:
    forming two or more metal containing layers over a transparent substrate;
    forming a main pattern and a monitor pattern within one or more of the two or more metal containing layers other than the lowermost metal containing layer in which a mask pattern is to be formed;
    removing the monitor pattern and forming the main pattern within the lowermost metal containing layer; and
    measuring the monitor pattern after forming the monitor pattern and before removing the monitor pattern.

* * * * *